United States Patent [19]
Iwasa

[11] Patent Number: 5,361,234
[45] Date of Patent: Nov. 1, 1994

[54] SEMICONDUCTOR MEMORY CELL DEVICE HAVING DUMMY CAPACITORS REDUCING BOUNDARY LEVEL CHANGES BETWEEN A MEMORY CELL ARRAY AREA AND A PERIPHERAL CIRCUIT AREA

[75] Inventor: Shinya Iwasa, Tokyo, Japan

[73] Assignee: NEC Corporation, Tokyo, Japan

[21] Appl. No.: 37,375

[22] Filed: Mar. 26, 1993

[30] Foreign Application Priority Data

Mar. 26, 1992 [JP] Japan .................................. 4-67809

[51] Int. Cl.$^5$ .............................................. G11C 13/00
[52] U.S. Cl. .................... 365/210; 257/303; 257/306; 257/296
[58] Field of Search ............... 257/296, 303, 306, 532, 257/534, 620, 623; 365/210

[56] References Cited
FOREIGN PATENT DOCUMENTS 0499375  3/1992  Japan .................................. 257/306

OTHER PUBLICATIONS

"A Half Micron Technology For An Experimental 16MBIT Dram Using i-Line Stepper", By Y. Kawamoto et al., pp. 17-18.

"3-Dimensional Stacked Capacitor Cell For 16M and 64M Drams" 1988 IEEE, By T. Ema et al., p. 592.
"Buried Bit-Line Cell for 64MB Drams", 1990 IEEE, By Y. Kohyama et al., p. 17.

Primary Examiner—Eugene R. LaRoche
Assistant Examiner—F. Niranjan
Attorney, Agent, or Firm—Young & Thompson

[57] ABSTRACT

A semiconductor memory device comprises a plurality of word lines, a plurality of digit lines, a peripheral circuit area and a memory cell array area. The memory cell array area comprises a semiconductor substrate having a surface in which field oxide films are selectively formed, a plurality of operational memory cells arrayed on active regions within the memory cell array area, each of which includes a stacked capacitor and a switching transistor, and a plurality of dummy capacitors arranged within the memory cell array area at an adjacent portion to a boundary area between the memory cell array area and the peripheral circuit area. The dummy capacitor is to receive affections caused by an inferiority of the accuracy of patterning by a photolithography in replacement of the operational memory cells. The dummy capacitor is so formed over the field oxide film as to prevent said digit line at said boundary area to have a rapid slope or a large difference in level.

5 Claims, 3 Drawing Sheets

SEMICONDUCTOR MEMORY CELL DEVICE HAVING DUMMY CAPACITORS REDUCING BOUNDARY LEVEL CHANGES BETWEEN A MEMORY CELL ARRAY AREA AND A PERIPHERAL CIRCUIT AREA

BACKGROUND OF THE INVENTION

The invention relates to an improvement in semiconductor memory cell device, and more particularly to an improvement in a high density stacked capacitor dynamic random access memory (DRAM) cell device.

In recent years, an improvement in a high integration of a semiconductor memory cell device such as a stacked capacitor dynamic random access memory cell device is required. Actually, whether a considerable improvement in the high integration of the semiconductor memory cell device is achievable depends upon fine pattern technologies. The realization of the high density semiconductor memory cell device, thus, depends upon how much scale down or high fine pattern of the device is accomplished. One of the most important factors concerned with the fine pattern technologies is the accuracy of patterning of the photo-lithography. Achievement of a possible improvement in the accuracy of patterning of the photo-lithography is important for accomplishment of the scaling down of the device. In addition, it is also important to secure a high reliability of the high density semiconductor memory cell device.

With respect to the fine structure of the device, 3-dimensional stacked capacitor cells for the dynamic random access memory device (DRAM) have been proposed to secure both the high density and the high reliability. The 3-dimensional stacked capacitor cell structure permits the stacked capacitor to have a relatively large capacitance with a relatively small area. The 3-dimensional stacked capacitor cell for the dynamic random access memory device (DRAM) has a high density. This is why the 3-dimensional stacked capacitor cell structure is attractive as one of the high density capacitor cell structures in replacement of the conventional cell plate structure for the dynamic random access memory device (DRAM).

Such 3-dimensional stacked capacitor cell for the dynamic random access memory device (DRAM) is, however, engaged with a disadvantage in a restriction on the improvement in the scaling down or the fine structure of the device. As described above, the accuracy of the patterning of the photo-lithography provides the restriction on the improvement in the scaling down or the fine structure of the device. It is important for implementation of the scaling down or the fine structure of the device to realize a possible high accuracy of the patterning of the photo-lithography. One of the important factors which define the accuracy of the patterning of the photo-lithography is the degree of the flatness of a device surface to be exposed to an ultra-violet ray for photo-etching in the photo-lithography process.

In general, when the leveling of the device surface to be exposed to the ultra-violet ray for the photo-etching of the photo-lithography is inferior, the accuracy of the patterning of the photo-lithography is also inferior. It is, thus, difficult to obtain a fine pattern of the device by the photo-etching of the present photo-lithography techniques. This results in the difficulty in implementation of the scaling down of the device. This makes it difficult to improve the high integration of the 3-dimensional stacked capacitor memory cell device.

In contrast, when the leveling of the device surface to be exposed to the ultra-violet ray for the photo-etching of the photo-lithography is superior, the accuracy of the patterning of the photo-lithography is also superior. It is thus possible to obtain a fine pattern of the device by the photo-etching of the present photo-lithography techniques. This results in the implementation of the scaling down of the device. From the above description, the following matters will be apparent.

The realization of the scaling down and thus the high accuracy of the patterning of the photo-lithography depends upon how much effective and sufficient leveling of the device surface to be subjected to the photo-lithography is achievable. Physically, it is, however, difficult to realize the complete leveling of the device surface. Particularly, in case of the 3-dimensional stacked capacitor cell for the dynamic random access memory device (DRAM), the difficulty in accomplishment of the complete leveling of the device surface is considerable. The causes of the difficulty in accomplishment of the leveling of the device surface to be exposed to the photo-lithography will be described. The 3-dimensional stacked capacitor cell dynamic random access memory device (DRAM) includes a memory cell array area and a peripheral circuit area which encompasses the memory cell array area. The memory cell array area includes stacked capacitors and switching transistors. The peripheral circuit area includes sense amplifiers and decoders and the like. Both the memory cell array area and the peripheral circuit area have a difference in the density of elements formed therein. Further, both the memory cell array area and the peripheral circuit area also have a difference in the level at a boundary area thereof. Such differences in the density and level which appear the boundary area between the memory cell array area and the peripheral circuit area provide an inferiority to the accuracy of the patterning of the photo-lithography at the boundary area between the memory cell array area and the peripheral circuit area. This further provides undesirable affections to the circuit performances of the 3-dimensional stacked capacitor cell dynamic random access memory device (DRAM). Such inferior accuracy of the patterning of the photo-lithography makes it difficult to improve the scaling down and the fine pattern of the device.

To combat the above problem in the leveling, it has been proposed to make adjacent memory cells to the boundary area serves as dummy memory cells. As described above, the inferiority in the accuracy of the patterning of the photo-lithography appears at the boundary area exhibiting the difference in the level between the memory cell array area and the peripheral circuit area. In this case even if there exists a relatively large difference in the level at the boundary area between the memory cell array area and the peripheral circuit area, only the dummy memory cells adjacent to the boundary area are subjected to undesirable affections of the inferiority in the accuracy of the patterning of the photo-lithography. This makes other operative memory cells free from such undesirable affections of the inferiority in the accuracy of the pattern of the photo-lithography. Even if the inferiority in the accuracy of the pattern of the photo-lithography appears in the dummy memory cell area, no inferiority in the accuracy of the pattern of the photo-lithography appears in the operational memory cell array area.

However, such 3-dimensional stacked capacitor memory cell device also has the following problem in the inferiority in the accuracy of the pattern of the photo-lithography. Such 3-dimensional stacked capacitor memory cell array includes a plurality of digit lines which lay not only in both the memory cell array area and the peripheral circuit area but also in the boundary area exhibiting the level difference. Thus, the problem in the inferiority in the accuracy of the pattern of the photo-lithography appears on the digit lines at the boundary area exhibiting the level difference.

The above mentioned matters concerned with the restriction on the scaling down and thus the fine pattern structure in the photo-lithography techniques will be more clear from the following description of one example of the 3-dimensional stacked capacitor cell structures for the dynamic random access memory device. FIGS. 1A and 1B are respectively plan and cross sectional elevation views which illustrate the structure of the conventional 3-dimensional stacked capacitor cell for the dynamic random access memory device.

The conventional 3-dimensional stacked capacitor cell for the dynamic random access memory device has a p-type silicon substrate 1. Field oxide films 11 are formed in a surface of the p-type silicon substrate 1 so that an active region is defined. Diffusion layers 3-1 and 3-2 are selectively formed in the active region of the surface of the p-type silicon substrate 1 whereby a channel region is defined between the n-type diffusion layers 3-1 and 3-2. The n-type diffusion layers 3-1 and 3-2 serve as source and drain regions of a switching transistor. A word line 4 is formed over the channel region of the switching transistor through an insulator film. The word line 4 serves as a gate electrode in the switching transistor region. The switching transistor in the memory cell comprises the source and drain regions of the n-type diffusion layers 3-1 and 3-2 and the gate electrode of the word-line 4.

An insulation film 12 is formed on the switching transistor region and the field oxide film 11. A contact hole C1 is formed in the insulator film 12 over one of the n-type diffusion layers 3-1 and 3-2 serving as the source and drain regions. A first capacitor electrode 6 is so formed as to contact through the contact hole C1 to the one of the n-type diffusion layers 3-1 and 3-2 serving as the source and drain diffusion layers. A capacitor insulation film 7 is so formed as to cover the first capacitor electrode 6. A second capacitor electrode 8 is formed on the capacitor insulation film 7 so that the stacked capacitor is formed. The stacked capacitor comprises the first and second capacitor electrodes 6 and 8 and the capacitor insulation film 7. The memory cell comprises the stacked capacitor and the switching transistor.

A first inter-layer insulator 13 is formed on the stacked capacitor and the insulation film 12. A digit line 10 is formed on the first inter-layer insulator 13. A second inter-layer insulator 14 is formed on the digit line 10. The digit line 10 serves to transmit digit signals. However, the digit line 10 is not electrically connected to another of the n-type diffusion layers 3-1 and 3-2 serving as the source and drain regions so as to make the memory cell comprising the stacked capacitor and the switching transistor becomes the dummy memory cell. Namely, the disconnection between the switching transistor and the digit line 10 does not allow the digit signals to be transmitted from the digit line 10 to the stacked capacitor through the switching transistor, even if the switching transistor takes ON state. This is why the memory cell serves as a dummy memory cell.

The dummy memory cells exists at the adjacent portions to the boundary area exhibiting a level difference H3 between the memory cell array area and the peripheral circuit area. The dummy memory cells are subjected to undesirable affections caused by the inferiority in the accuracy of the pattern of the photo-lithography in replacement of the operational memory cells. Namely, the undesirable affection in the inferiority in the accuracy of the pattern of the photo-lithography is caused by the level difference H3 existing at the boundary area between the memory cell array area and the peripheral circuit area. Even if the dummy memory cells adjacent to the boundary area suffer the affection of the inferiority in the accuracy of the pattern of the photo-lithography, no problem in the inferior accuracy of the pattern of the photo-lithography occurs in the operational memory cell array area.

As described above, the digit line 10, however, lays in not only both the memory cell array area and the peripheral circuit area but also the boundary area exhibiting the level difference H3 which causes the inferiority in the accuracy of the pattern of the photo-lithography. This is why the digit line 10 is engaged with the problem in appearance of the inferiority of the accuracy of the pattern of the photo-lithography at the boundary area expressing the level difference H3. As the level difference is large, the inferiority in the accuracy of the pattern of the photo-lithography is considerable. Since the 3-dimensional stacked capacitor memory cell array has the relatively large difference H3 in the level, the inferiority in the accuracy of the pattern of the photo-lithography is considerable. Such inferior accuracy of the pattern makes it difficult for the 3-dimensional stacked capacitor memory cell array device to obtain a fine pattern. This provides a restriction on the scaling down of the device.

The caution of the above mentioned problem with the digit line 10 is in the level difference H3 appearing at the boundary area between the memory cell array area and the peripheral circuit area. If there exists no large difference in the level at the boundary area between the memory cell array area and the peripheral circuit area, the digit line 10 is free from the problem in the inferiority in the accuracy of the pattern of the photo-lithography which provides the restriction on accomplishments of the scaling down and the fine pattern structure of the device. Such restriction on the accomplishments of the scaling down and the fine pattern structure of the device makes the improvement in the high high integration or the high density of the memory cell device difficult.

It is, therefore, required for overcoming the above problem to realize such effective and sufficient leveling of the device surface particularly the digit lines 10 that the inferiority in the accuracy of the pattern of the photo-lithography does not appear at the boundary area between the memory cell array area and the peripheral circuit area.

SUMMARY OF THE INVENTION

Accordingly, it is a primary object of the present invention to provide a novel semiconductor memory cell array device.

It is a further object of the present invention to provide a novel semiconductor memory cell array device having a fine pattern structure.

It is yet a further object of the present invention to provide a novel semiconductor memory cell array device having an improved leveled structure adjacent to a boundary area between a memory cell array area and a peripheral circuit area.

It is a still further object of the present invention to provide a novel semiconductor memory cell array device having such effectively and sufficiently leveled digit lines that no inferiority in the accuracy of pattern of a photo-lithography appears at the boundary area between the memory cell array area and the peripheral circuit area.

The above and other objects, features and advantages of the present invention will be apparent from the following descriptions.

The present invention provides a novel semiconductor memory device comprising a plurality of word lines, a plurality of digit lines, a peripheral circuit area and a memory cell array area. The memory cell array area includes a semiconductor substrate having a surface in which field oxide films are selectively formed. The memory cell array area also includes a plurality of operational memory cells arrayed on active regions within the memory cell array area, each of which includes a stacked capacitor and a switching transistor. The memory cell array area also includes a plurality of dummy cells arranged within the memory cell array area at an adjacent portion to a boundary area between the memory cell array area and the peripheral circuit area. The dummy cell is to receive affections caused by an inferiority of the accuracy of patterning by a photo-lithography in replacement of the operational memory cells. The dummy cell is so formed over the field oxide film as to prevent the digit lines to have a rapid slope or a large difference in level at the boundary area.

BRIEF DESCRIPTION OF THE DRAWINGS

The preferred embodiments of the present invention will hereinafter fully be described in detail with reference to the accompanying drawings.

PREFERRED EMBODIMENTS OF THE INVENTION

The present invention provides a novel structure of the stacked capacitor memory cell array device having improved dummy memory cell structure. The improved dummy memory cells are arranged at the adjacent portion to the boundary area between the memory cell array area and the peripheral circuit area. The improved dummy memory cell comprises a dummy capacitor that is formed on the field oxide film region outside the active region. In the present invention, all of the stacked capacitors are operational as memory cell capacitors. In contrast, in the prior art the adjacent stacked capacitors to the boundary area between the memory cell array area and the peripheral circuit area are the dummy stacked capacitors. The existence of the dummy capacitors is necessary to prevent the memory cell array area including the operational stacked capacitors to suffer undesirable affections caused by the inferiority of the patterning by the photo-lithography. Further, the dummy capacitor of the present invention has such a completely different structure from the operational stacked capacitor that the level difference of the digit line is reduced considerably. Such dummy capacitor and the stacked capacitor are concurrently formed.

Figure 2A:
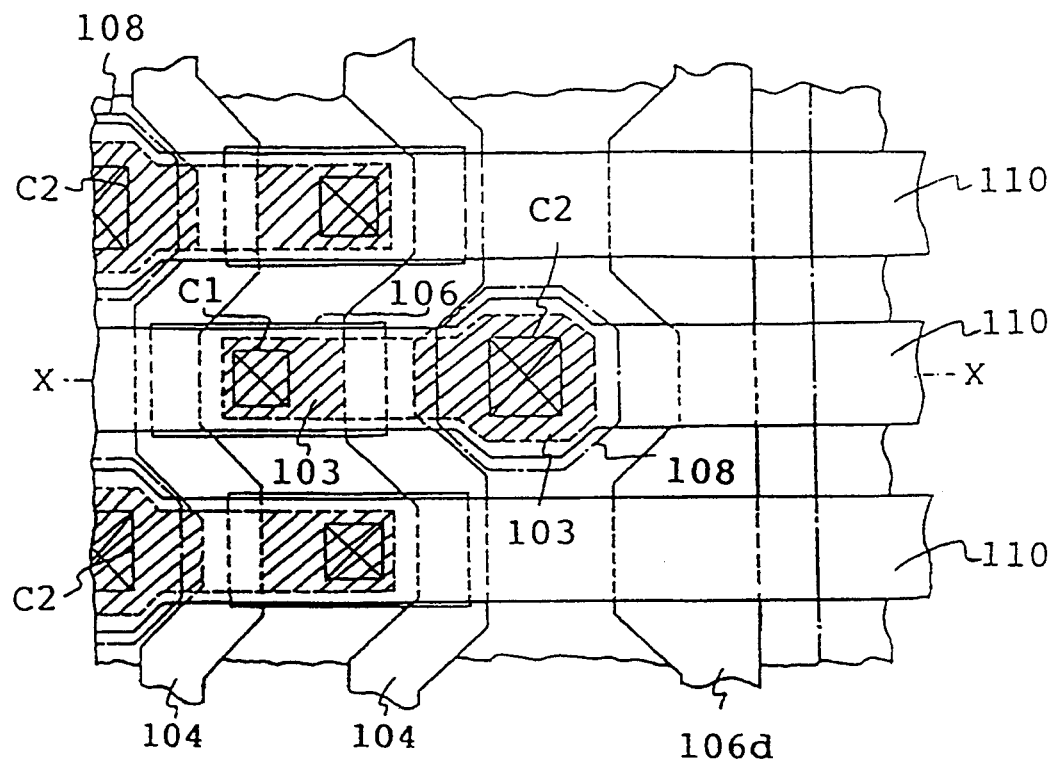
FIG. 2A is a fragmentary plan view illustrative of a novel 3-dimensional stacked capacitor memory cell array device of a first embodiment according to the present invention.

A first embodiment according to the present invention will be described with reference to FIGS. 2A and 2B.

A novel stacked capacitor memory cell array device has a p-type silicon substrate 101. Field oxide films 111 are selectively formed in a surface of the p-type silicon substrate 101 by use of a local oxidation of silicon method thereby an active region for formations of both a stacked capacitor and a switching transistor is defined. A gate oxide film is formed on the active region of an exposed surface of the p-type silicon substrate 101. A polycrystalline silicon film having a thickness of approximately 300 nanometers is grown on the gate oxide film, followed by ion-implantation and patterning thereto so that word lines 104 are formed. The word line 104 in the memory cell area serves as a gate of a switching transistor. An ion-implantation of an n-type dopant to the active region of an exposed surface of the p-type silicon substrate 101 is conducted for a subsequent diffusion of the n-type dopant so that n-type diffusion layers 103-1 and 103-2 are formed in the active region. The formation of the n-type diffusion layers 103-1 and 103-2 defines a channel region between the n-type diffusion layers 103-1 and 103-2. The n-type diffusion layers 103-1 and 103-2 serve as source and drain regions of the switching transistor in the memory cell. As a result, formed in the memory cell is the switching transistor which comprises the source and drain regions of the n-type diffusion layers 103-1 and 103-2 and the gate electrode of the word line 104.

Subsequently, an insulation film 112 is formed on an entire surface of the device whereby the work line 104 is covered with the insulation film 112. After that, a contact hole C1 is formed in the insulation film 112 but directly over the n-type source/drain diffusion layer 103-1. A polycrystalline silicon film having a thickness of approximately 300 nanometers is grown thereby the contact hole C1 is so filled with the polycrystalline silicon film that the polycrystalline silicon film is made into contact with the n-type source/drain diffusion layer 103-1. The polycrystalline silicon film is subjected to such patterning as to make the polycrystalline silicon film remain not only in the vicinity of the contact hole C1 but also in a predetermined area which exists outside the active region and thus over the field oxide film 111. This results in that a first electrode 106 for a stacked capacitor is formed on the insulation film 112 in the vicinity of the contact hole C1. Concurrently, a dummy capacitor electrode 106d is formed in the predetermined area over the field oxide film 111. A capacitor insulation film is formed on an entire surface of the device so that the first stacked capacitor electrode 106 and the dummy capacitor electrode 106d are covered with the capacitor insulation film, after which the capacitor insulation film is subjected to such patterning as to make the capacitor insulation film cover not only the first stacked capacitor electrode 106 but also the dummy capacitor electrode 106d. As a result, the stacked capacitor insulation film 107 and the dummy capacitor insulation film are concurrently formed. A polycrystalline silicon film is further grown on an entire surface of the device so as to cover the stacked capacitor insulation film 107 and the dummy capacitor insulation film, after which the polycrystalline silicon film is subjected to such patterning as to have the polycrystalline silicon film remain on not only the stacked capacitor insulation film 107 but also the dummy capacitor insulation film. As a result, a second electrode 108 for the stacked capacitor and a dummy capacitor opposite electrode are concurrently formed. Thus, it is understood that the stacked capacitor which is operational as the memory cell and the dummy capacitor are concurrently formed in the same fabrication process. Thus, the stacked capacitor and the dummy capacitor are formed in the active region and the non-active region outside the active region respectively.

Subsequently, a first inter-layer insulator 113 is grown on an entire surface of the device so as to cover both the stacked capacitor and the dummy capacitor. A second contact hole C2 is so formed in both the first inter-layer insulator 113 and the insulation film 112 that a part of the n-type source/drain diffusion layer 103-2 is exposed though the second contact hole C2. After that, a polycrystalline silicon film is grown on an entire surface of the device so that the polycrystalline silicon film is made to contact with the exposed part of the n-type source/drain diffusion layer 103-2. The polycrystalline silicon film is subjected to such patterning that a plurality of digit lines 110 are formed over the stacked capacitor, the switching transistor and the dummy capacitor. The digit lines lay not only in the memory cell array area including the operational stacked capacitors but also in the peripheral circuit area and the boundary area. The patterning for formation of the digit lines 110 is accomplished by use of the ultra-violet rays for the photo-etching of the photo-lithography. Digital signals are transmitted though the digit line 110 to the n-type source/drain diffusion layer 103-2 and then transmitted through the switching transistor to the first stacked capacitor electrode 106. The digital signal is stored in the stacked capacitor serving as the memory cell.

Subsequently, a second inter-layer insulator 114 is formed on an entire surface of the device so that the digit lines 110 are covered with the second inter-layer insulator 114.

The digit line 110 lays over the stacked capacitor memory cell array area including the dummy capacitor area but also a peripheral circuit area, in addition the boundary area between the memory cell array area and the peripheral circuit area. Each of the digit lines 110 exhibits a small level difference H1 at the boundary area between the memory cell array area and the peripheral circuit area. The digit line 110 of the first embodiment according to the present invention has the relatively small level difference H1 at the boundary area as compared to the level difference H3 of the digit line 10 in the prior art. The reason why the level difference H1 is smaller than the level difference H3 will be described with reference to FIGS. 1B and 2B.

Figure 1A:
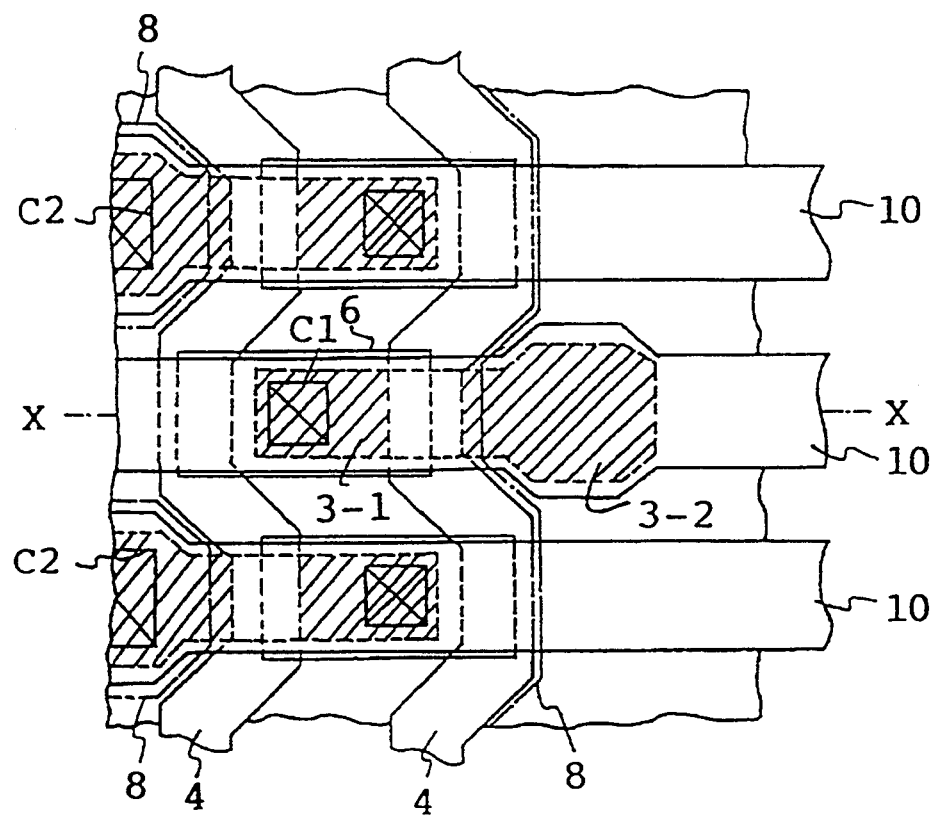
FIG. 1A is a fragmentary plan view illustrative of the conventional 3-dimensional stacked capacitor memory cell array device.
Figure 1B:
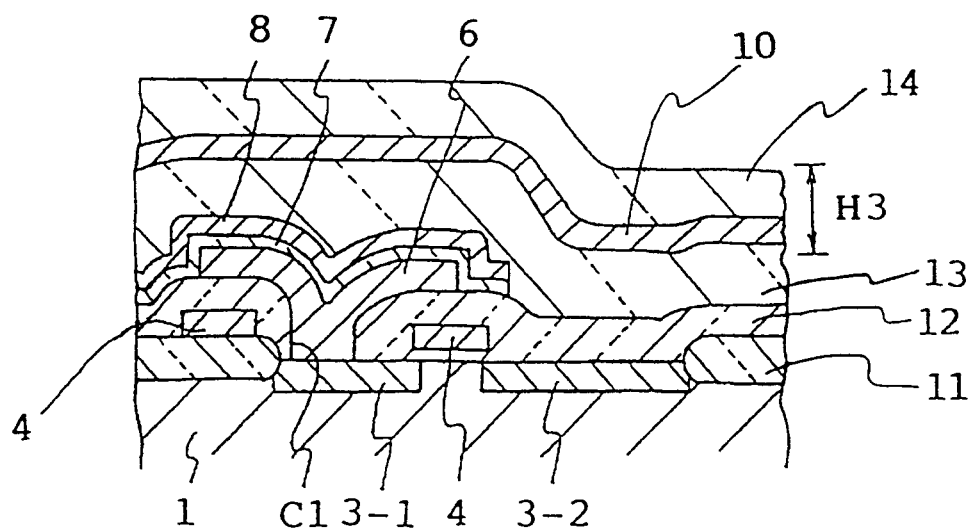
FIG. 1B is a fragmentary cross sectional elevation view illustrative of the conventional 3-dimensional stacked capacitor memory cell array device.

In the prior art illustrated in FIG. 1B, the first stacked capacitor electrode 6 overlays the insulation film 12 which includes the word line 4 serving as the gate electrode of the switching transistor in the memory cell. Further, the stacked capacitor insulation film 7 and the second stacked capacitor electrode 8 are in turn stacked on the first stacked capacitor electrode 6. Further, the first inter-layer insulator 13 but in the memory cell array area overlays the stacked capacitor. The digit line 10 but in the memory cell array area overlays the first inter-layer insulator 13 which overlays the stacked capacitor. Concurrently, the digit line 10 is directly over the n-type diffusion layer 3-2 and thus at the boundary area overlays the first inter-layer insulator 13 formed on the insulation film 12. Therefore, the digit line 10 directly over the stacked capacitor lays above the digit line 10 is directly over the n-type diffusion layer 3-2 and thus at the boundary area by a sum of a thickness of the word line 4 and a height of the stacked capacitor, for example, a total thickness of the first and second stacked capacitor electrodes 6 and 8 and the stacked capacitor insulation film 7. The level difference H3 of the digit line 10 at the boundary area is, hence, defined by the total thickness of the word line 4 and the stacked capacitor, for example, the first and second stacked capacitor electrodes 6 and 8 and the stacked capacitor insulation film 7. Namely, the level difference H3 of the digit line 10 at the boundary area is caused by the existences of the word line 4 and the stacked capacitor comprising the first and second stacked capacitor electrodes 6 and 8 and the stacked capacitor insulation film 7. That is why in the prior art the digit line 10 necessarily has such relatively large level difference H3 at the boundary area between the memory cell array area and the peripheral circuit area.

Figure 2B:
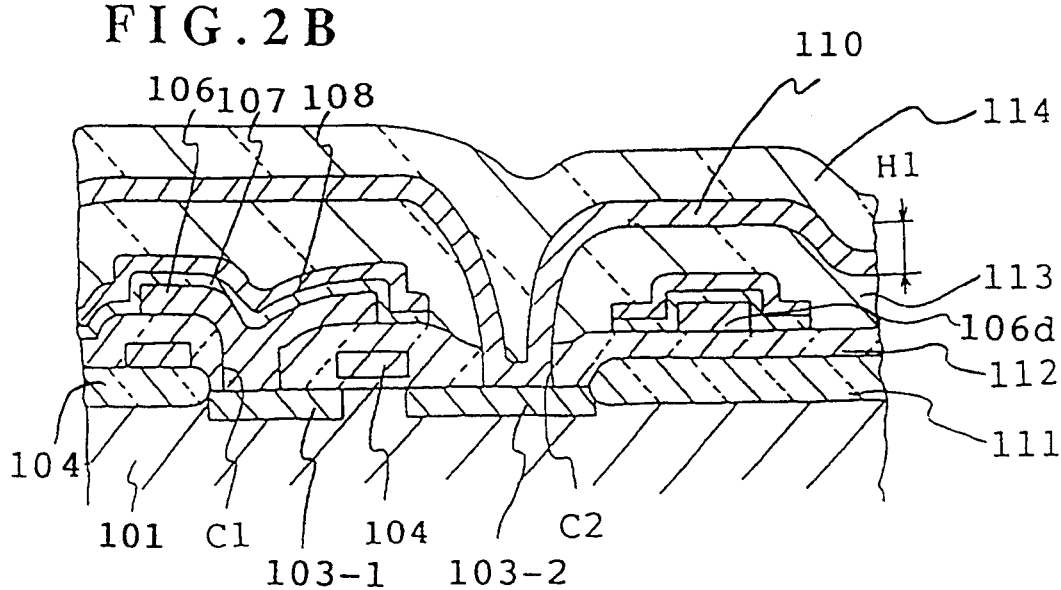
FIG. 2B is a fragmentary cross sectional elevation view, taken along X—X line of FIG. 2A, which is illustrative of a novel 3-dimensional stacked capacitor memory cell array device of a first embodiment according to the present invention.

On the other hand, in the first embodiment according to the present invention illustrated in FIG. 2B, the dummy capacitor electrode 106d overlays the insulation film 112 formed on the filed oxide film 111. As described above, since both the dummy capacitor electrode 106d and the first stacked capacitor electrode 106 are formed by patterning from the single polycrystalline silicon film, the thicknesses of the both are necessarily almost the same as each other. Such dummy capacitor electrode 106d is overlaid with the dummy capacitor insulation film and the dummy capacitor opposite electrode. The dummy capacitor is overlaid with the first inter-layer insulator 113. In contrast, the digit line 110 in the peripheral circuit area overlays the first inter-layer insulator which does not overlay element such as dummy capacitor. The digit line 110 directly over the dummy capacitor including the dummy capacitor electrode 106d lays above the digit line 110 in the peripheral circuit area by a height of the dummy capacitor or a total thickness of the dummy capacitor electrode 106d, the dummy capacitor insulation film and the dummy capacitor opposite electrode. The level difference H1 of the digit line 110 at the boundary area is defined by the height of the dummy capacitor. Namely, the level difference H1 of the digit line 110 at the boundary area is caused by the existences of the dummy capacitor only. That is why in the first embodiment according to the present invention the digit line 110 is able to have such relatively small level difference at the boundary area between the memory cell array area and the peripheral circuit area. When the level differences H1 and H3 are compared to each other, the level difference H1 of the digit line 110 in the first embodiment according to the present invention is smaller than the level difference H3 in the prior art by approximately the thickness of the word line 4. That is why the existence of the dummy capacitor including the dummy capacitor electrode 106d but over the field oxide film 111 through the insulation film 112 permits the level difference of the digit line 110 at the boundary area to be so reduced from H3 to H1 that no inferiority in the accuracy of the patterning of the digit line 110 by the photo-lithography appears. Physically, the digit line 110 at the boundary area having the small level difference H1 is able to be completely free from the inferiority in the accuracy of the patterning of the digit line 110 by the photo-lithography. This allows the digit line 110 to have a desirable fine pattern not only in the memory cell array area and the peripheral circuit area but also at the boundary area exhibiting the small level difference H1. Needless to say, all of the operational stacked capacitors are free from the inferiority in the accuracy of the patterning by the photo-lithography, even if the dummy capacitor including the dummy capacitor electrode 106d suffers the inferiority in the accuracy of the patterning by the photo-lithography. As a result, the existence of the dummy capacitor over the field oxide film 111 permits accomplishments of the fine structures of not only the stacked capacitor cells but also the digit lines 110 particularly at the boundary area between the memory cell array area and the peripheral circuit area. The accomplishments of the fine structures permits a high integration and a high density of the stacked capacitor memory cell array device.

Figure 3A:
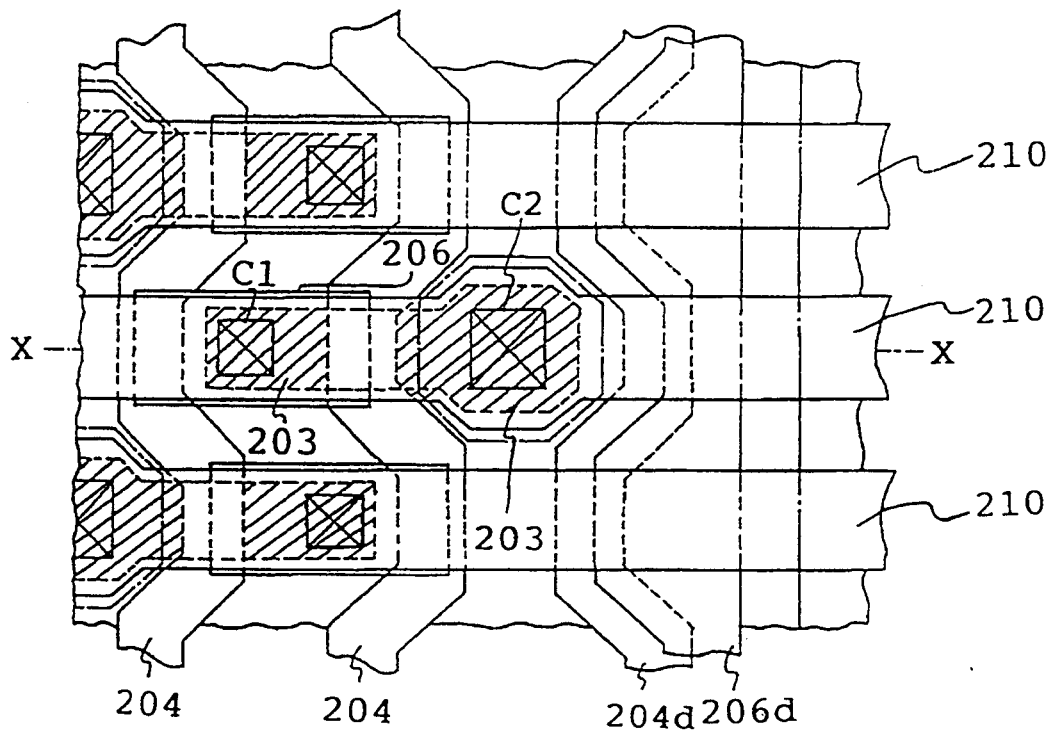
FIG. 3A is a fragmentary plan view illustrative of a novel 3-dimensional stacked capacitor memory cell array device of a second embodiment according to the present invention.

A second embodiment according to the present invention will be described with reference to FIGS. 3A and 3B.

A novel stacked capacitor memory cell array device has a p-type silicon substrate 201. Field oxide films 211 are selectively formed in a surface of the p-type silicon substrate 201 by use of a local oxidation of silicon method to define an active region for formations of both a stacked capacitor and a switching transistor. A gate oxide film is formed on the active region of an exposed surface of the p-type silicon substrate 201. A polycrystalline silicon film is grown on the gate oxide film, followed by ion-implantation and patterning thereto so that both word lines 204 and dummy word line 204d are formed. The word line 204 in the memory cell area serves as a gate of a switching transistor. The dummy word line 204d is formed on the field oxide film 211. An ion-implantation of an n-type dopant to the active region of an exposed surface of the p-type silicon substrate 201 is conducted for a subsequent diffusion of the n-type dopant so that n-type diffusion layers 203-1 and 203-2 are formed in the active region. The formation of the n-type diffusion layers 203-1 and 203-2 defines a channel region between the n-type diffusion layers 203-1 and 203-2. The n-type diffusion layers 203-1 and 203-2 serve as source and drain regions of the switching transistor in the memory cell. As a result, formed in the memory cell is the switching transistor which comprises the source and drain regions of the n-type diffusion layers 203-1 and 203-2 and the gate electrode of the word line 204.

Subsequently, an insulation film 212 is formed on an entire surface of the device whereby the word line 204 and the dummy word line 204d are covered with the insulation film 212. After that, a contact hole C1 is formed in the insulation film 212 but directly over the n-type source/drain diffusion layer 203-1. A polycrystalline silicon film is grown thereby to fill the contact hole C1 with the polycrystalline silicon film so that the polycrystalline silicon film is made into contact with the n-type source/drain diffusion layer 203-1. The polycrystalline silicon film is subjected to such patterning as to make the polycrystalline silicon film remain not only in the vicinity of the contact hole C1 but also in a predetermined area which exists outside the active region and thus on the insulation film 212 which overlays the dummy word line 204d formed on the field oxide film 211. This results in that a first electrode 206 for a stacked capacitor is formed on the insulation film 212 in the vicinity of the contact hole C1. Concurrently, a dummy capacitor electrode 206d is formed in the predetermined area on the insulation film 212 which overlays the dummy word line 204d formed on the field oxide film 211. It is, however, important that the dummy capacitor electrode 206d overlays a sloped portion of the insulation film 212 so that the dummy capacitor electrode 206d also slopes gently down toward the boundary area to the peripheral circuit area. A capacitor insulation film is formed on an entire surface of the device, after which the capacitor insulation film is subjected to such patterning as to make the capacitor insulation film cover not only the first stacked capacitor electrode 206 but also the dummy capacitor electrode 206d. As a result, the stacked capacitor insulation film 207 and the dummy capacitor insulation film are concurrently formed. A polycrystalline silicon film is further grown on an entire surface of the device after which the polycrystalline silicon film is subjected to such patterning as to have the polycrystalline silicon film remain on not only the stacked capacitor insulation film 207 but also the dummy capacitor insulation film. As a result, a second electrode 208 for the stacked capacitor and a dummy capacitor opposite electrode are concurrently formed. The dummy capacitor opposite electrode slopes down toward the boundary area to the peripheral circuit area. Thus, it is understood that the stacked capacitor which is operational as the memory cell and the dummy capacitor are concurrently formed in the same fabrication process. Thus, the stacked capacitor and the dummy capacitor are formed in the active region and the non-active region outside the active region respectively.

Subsequently, a first inter-layer insulator 213 is grown on an entire surface of the device so as to cover both the stacked capacitor and the dummy capacitor. A second contact hole C2 is so formed in both the first inter-layer insulator 213 and the insulation film 212 that a part of the n-type source/drain diffusion layer 203-2 is exposed though the second contact hole C2. After that, a polycrystalline silicon film is grown on an entire surface of the device so that the polycrystalline silicon film is made into contact with the exposed part of the n-type source/drain diffusion layer 203-2. The polycrystalline silicon film is subjected to such patterning that a plurality of digit lines 210 are formed over the stacked capacitor, the switching transistor and the dummy capacitor. The digit lines lay not only in the memory cell array area including the operational stacked capacitors but also in the peripheral circuit area and the boundary area. The patterning for formation of the digit lines 210 is accomplished by use of the ultra-violet rays for the photo-etching of the photo-lithography. Digital signals are transmitted though the digit line 210 to the n-type source/drain diffusion layer 203-2 and then transmitted through the switching transistor to the first stacked capacitor electrode 206. The digital signal is stored in the stacked capacitor serving as the memory cell.

Subsequently, a second inter-layer insulator 214 is formed on an entire surface of the device so that the digit lines 210 are covered with the second inter-layer insulator 214.

The digit line 210 lays over the stacked capacitor memory cell array area including the dummy capacitor area but also a peripheral circuit area, in addition the boundary area between the memory cell array area and the peripheral circuit area. Each of the digit lines 210 has a gently sloped portion at the boundary area between the memory cell array area and the peripheral circuit area. The digit line 210 of the second embodiment according to the present invention has the relatively gently sloped portion at the boundary area as compared to the rapid sloped portion of the digit line 210 in the prior art. The reason why the slope of the digit line 210 at the boundary area is gentler than the sloped portion of the digit line 10 in the prior art will be described with reference to FIG. 3B.

Figure 3B:
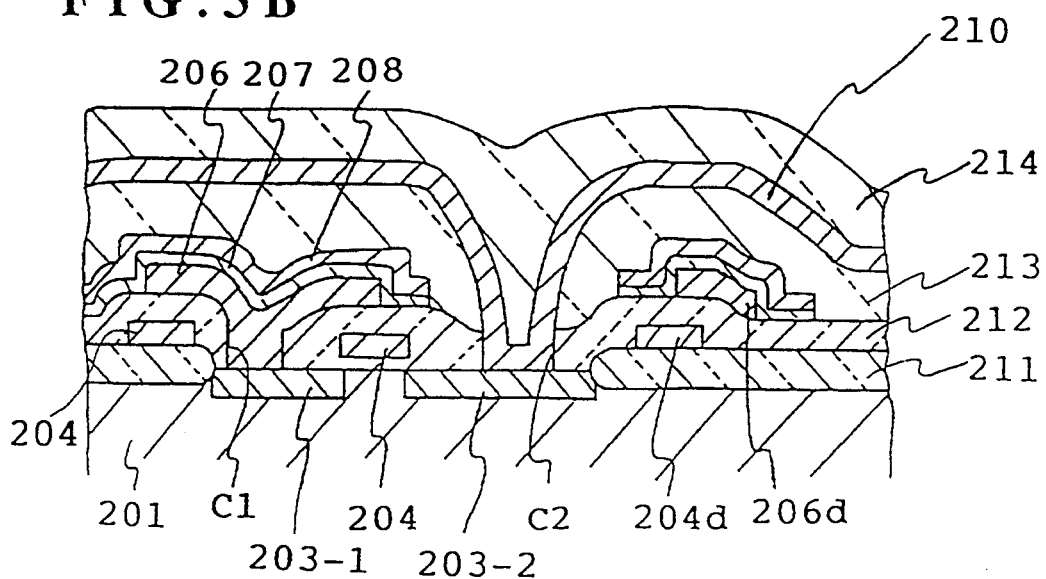
FIG. 3B is a fragmentary cross sectional elevation view, taken along X—X line of FIG. 3A, which is illustrative of a novel 3-dimensional stacked capacitor memory cell array device of a second embodiment according to the present invention.

In FIG. 3B, the dummy capacitor electrode 206d overlays the sloped portion of the insulation film 212 which overlays the dummy word line 204d formed on the field oxide film 111. As described above, since both the dummy capacitor electrode 206d and the first stacked capacitor electrode 206 are formed by patterning from the single polycrystalline silicon film, the thicknesses of the both are necessarily almost the same as each other. Such dummy capacitor electrode 206d is overlaid with the dummy capacitor insulation film and the dummy capacitor opposite electrode. The dummy capacitor is overlaid with the first inter-layer insulator 213. In contrast, the digit line 210 in the peripheral circuit area overlays the first inter-layer insulator which does not overlay element such as dummy capacitor. The dummy capacitor has the gentle sloped portion down toward the boundary area. The first inter-layer insulator 213 has thus also a gentle sloped portion down toward the boundary area. The digit line 210 therefore has a gentle sloped portion at the boundary area. It is important that the digit line 210 at the boundary area has such a sufficiently gentle sloped portion to be able to prevent the inferiority in the accuracy of the patterning by the photo-lithography. Such gentle slope of the digit line 210 at the boundary area allows the digit line 110 to have a desirable fine pattern not only in the memory cell array area and the peripheral circuit area but also at the boundary area exhibiting the gentle slope. Needless to say, all of the operational stacked capacitors are free from the inferiority in the accuracy of the patterning by the photo-lithography, even if the dummy capacitor including the dummy capacitor electrode 206d suffers the inferiority in the accuracy of the patterning by the photo-lithography. As a result, the existence of the gently sloped dummy capacitor over the field oxide film 211 permits accomplishments of the fine structures of not only the stacked capacitor cells but also the digit lines 210 particularly at the boundary area between the memory cell array area and the peripheral circuit area. The accomplishments of the fine structures permits a high integration and a high density of the stacked capacitor memory cell array device.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is intended to cover by the appended claims all modifications which fall within the sprit and scope of the invention.

What is claimed is:

1. A semiconductor memory device comprising:
   a plurality of word lines;
   a plurality of digit lines;
   a peripheral circuit area; and
   a memory cell array area comprising:
   a semiconductor substrate having a surface in which field oxide films are selectively formed;
   a plurality of operational memory cells arrayed on active regions within said memory cell array area, each of said memory cells including a stacked capacitor and a switching transistor; and
   a plurality of dummy capacitors arranged in a boundary area between said memory cell array area and said peripheral circuit area, said dummy capacitors each comprising a pair of electrode layers and an intermediate insulation layer, each of said pair of electrode layers and said intermediate insulation layers comprising side portions proximate said peripheral circuit area and opposite side portions proximate said memory cell array area,
   wherein at least said side portions of said electrode layers and insulation layers proximate said peripheral circuit area overlie said field oxide films without overlying any of said word lines.

2. The semiconductor memory device as claimed in claim 1, wherein said dummy capacitors overlie said semiconductor substrate without any portion thereof overlying any of said word lines.

3. The semiconductor memory device as claimed in claim 2, wherein said dummy capacitors and said stacked capacitors are concurrently formed in the same fabrication process.

4. The semiconductor memory device as claimed in claim 1, further comprising dummy word lines underlying said opposite side portions of said pair of electrode layers and said intermediate insulation layers of said dummy capacitors, whereby said dummy capacitors slope downwardly from said opposite portions proximate said memory cell array area to said side portions proximate said peripheral circuit area.

5. The semiconductor memory device as claimed in claim 4, wherein said dummy capacitors and said stacked capacitors are concurrently formed in the same fabrication process, and wherein said dummy word lines and said operational word lines are concurrently formed in the same process.

* * * * *